(12) United States Patent
Kaneko (10) Patent No.: US 7,382,813 B2
(45) Date of Patent: Jun. 3, 2008

(54) SURFACE-EMITTING TYPE SEMICONDUCTOR LASER AND METHOD FOR MANUFACTURING THE SAME

(75) Inventor: Tsuyoshi Kaneko, Shimosuwa-machi (JP)

(73) Assignee: Seiko Epson Corporation, Tokyo (JP)

( * ) Notice: Subject to any disclaimer, the term of this patent is extended or adjusted under 35 U.S.C. 154(b) by 101 days.

(21) Appl. No.: 11/279,527

(22) Filed: Apr. 12, 2006

(65) Prior Publication Data

US 2006/0262824 A1 Nov. 23, 2006

(30) Foreign Application Priority Data

May 20, 2005 (JP) ............... 2005-148047

(51) Int. Cl.
*H01S 5/00* (2006.01)

(52) U.S. Cl. ............... 372/46.01; 372/43.01; 372/87

(58) Field of Classification Search ............ 372/46.01, 372/43.01, 87
See application file for complete search history.

(56) References Cited

U.S. PATENT DOCUMENTS 6,661,823 B1* 12/2003 Otoma et al. ............ 372/49.01
6,816,527 B2   11/2004 Ueki

FOREIGN PATENT DOCUMENTS

JP   A 2004-63707   2/2004

* cited by examiner

*Primary Examiner*—Dung T Nguyen
(74) *Attorney, Agent, or Firm*—Oliff & Berridge, PLC (57) ABSTRACT

A surface-emitting type semiconductor laser includes a first mirror, an active layer formed above the first mirror, a second mirror formed above the active layer, a first electrode formed above the second mirror, and a second electrode formed above the first electrode, wherein each of the first electrode and the second electrode has an opening section, and the opening section of the first electrode is formed inside the opening section of the second electrode in a plan view.

12 Claims, 5 Drawing Sheets

SURFACE-EMITTING TYPE SEMICONDUCTOR LASER AND METHOD FOR MANUFACTURING THE SAME

The entire disclosure of Japanese Patent Application No. 2005-148047, filed May 20, 2005 is expressly incorporated by reference herein.

BACKGROUND

1. Technical Field

The present invention relates to surface-emitting type semiconductor lasers and methods for manufacturing the same.

2. Related Art

Surface-emitting type semiconductor lasers are semiconductor lasers that emit a laser beam orthogonal to the semiconductor substrate, and can be readily examined during their processing compared to edge-emitting type semiconductor lasers, and their radiation pattern is circular, such that surface-emitting type semiconductor lasers are expected to be applied as various sensors and light sources for optical communications. When surface-emitting type semiconductor lasers are used for sensors and optical communications, it is desirous to obtain a laser beam having a radiation pattern with a narrow radiation angle.

To narrow the radiation angle, the film thickness of the electrode formed around the emission surface should preferably be small. However, when the film thickness is small, problems such as lowered radiation efficiency, lowered wire bonding property and the like would occur. Japanese Laid-open patent application JP-A-2004-63707 describes an example of related art.

SUMMARY

In accordance with an advantage of some aspects of the present invention, there are provided a surface-emitting type semiconductor laser with which a laser beam having a radiation pattern with a narrow radiation angle can be obtained and the wire bonding property can be improved, and a method for manufacturing such a surface-emitting type semiconductor laser.

A surface-emitting type semiconductor laser in accordance with an embodiment of the invention includes: a first mirror; an active layer formed above the first mirror; a second mirror formed above the active layer; a first electrode formed above the second mirror; and a second electrode formed above the first electrode wherein each of the first electrode and the second electrode has an opening section, and the opening section of the first electrode is formed inside the opening section of the second electrode.

In the surface-emitting type semiconductor laser in accordance with an aspect of the embodiment of the invention, at least the active layer and the second mirror may form a columnar section, and the second electrode may be formed above at least the columnar section.

In the surface-emitting type semiconductor laser in accordance with another aspect of the embodiment of the invention, the second electrode may have a film thickness greater than a film thickness of the first electrode.

In the surface-emitting type semiconductor laser in accordance with another aspect of the embodiment of the invention, the first electrode may have a film thickness D1 that satisfies Formula (1) below.

$$(4i+1)\lambda/8n \leq D1 \leq (4i+3)\lambda/8n \tag{1}$$

(In Formula (1), i is an integer, $\lambda$ is an oscillation wavelength, and n is a refractive index of the material of the electrode.)

In the surface-emitting type semiconductor laser in accordance with another aspect of the embodiment of the invention, the second electrode may have a film thickness D2 that satisfies Formula (2) below.

$$A \geq D2 \times \tan(\theta/2) \tag{2}$$

(In Formula (2), A is a difference between a diameter of an emission surface and an inner diameter of the second electrode, and $\theta$ is a radiation angle.)

In the surface-emitting type semiconductor laser in accordance with another aspect of the embodiment of the invention, the second electrode may have a film thickness of 0.2 µm or greater.

In the surface-emitting type semiconductor laser in accordance with another aspect of the embodiment of the invention, the first electrode may be formed from a single layer or a laminated film of two or more layers each composed of one of Au, Pt, Ti, Ge, Zn, Ni, In, W, Cr and an alloy thereof.

In the surface-emitting type semiconductor laser in accordance with another aspect of the embodiment of the invention, the second electrode may be formed from a single layer or a laminated film containing Au at least at its topmost surface.

In the surface-emitting type semiconductor laser in accordance with another aspect of the embodiment of the invention, the second electrode may have an electrode pad section.

In the surface-emitting type semiconductor laser in accordance with another aspect of the embodiment of the invention, each of the first electrode and the second electrode may have an open ring shape.

A method for manufacturing a surface-emitting type semiconductor laser in accordance with another embodiment of the invention includes the steps of: forming a first mirror above a substrate; forming an active layer above the substrate; forming a second mirror above the first mirror; forming a first electrode above the second mirror; heating at least the first electrode; and forming a second electrode above the first electrode such that a portion around an emission surface provided by the first electrode is exposed.

DESCRIPTION OF EXEMPLARY EMBODIMENTS

Examples of preferred embodiments of the invention are described below with reference to the accompanying drawings.

1. Structure of Surface-Emitting Type Semiconductor Laser

Figure 1:
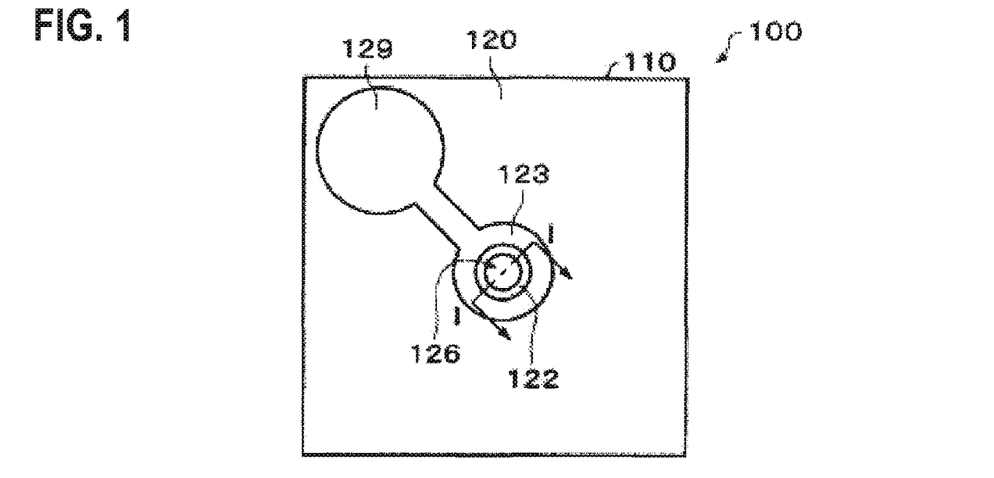
FIG. 1 schematically shows a plan view of a surface-emitting type semiconductor laser in accordance with an embodiment of the invention.
Figure 2:
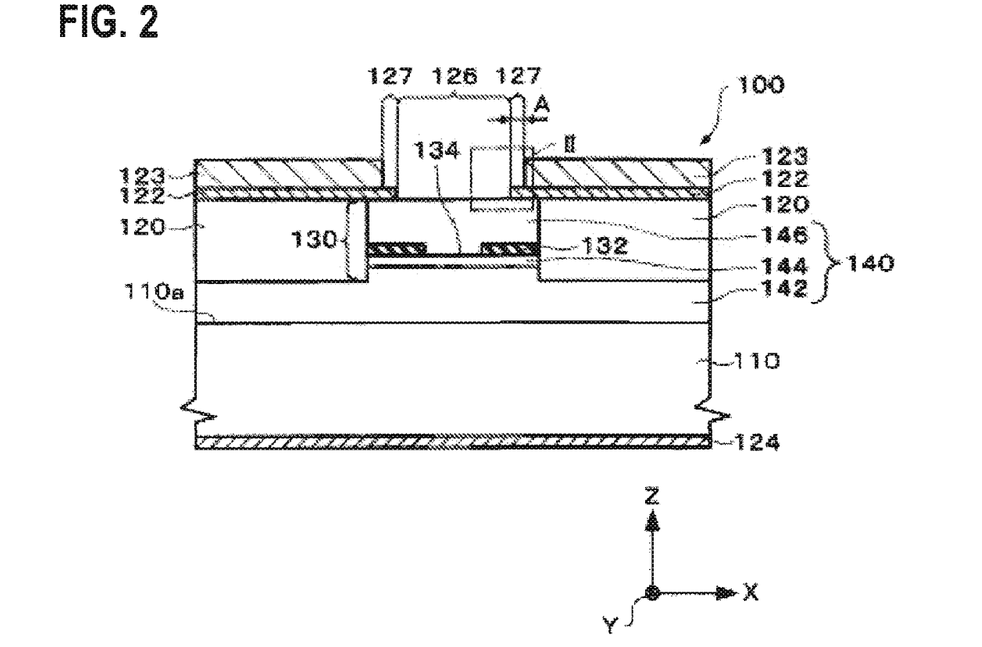
FIG. 2 schematically shows a cross-sectional view of the surface-emitting type semiconductor laser in accordance with the present embodiment.

First, the structure of a surface-emitting type semiconductor laser in accordance with an embodiment is described. FIG. 1 is a plan view of a surface-emitting type semiconductor laser in accordance with an embodiment of the invention. FIG. 2 is a cross-sectional view of the surface-emitting type semiconductor laser in accordance with the present embodiment, which shows a cross section taken along a line I-I of FIG. 1.

As shown in FIG. 1 and FIG. 2, the surface-emitting type semiconductor laser 100 of the present embodiment includes a semiconductor substrate (a GaAs substrate in the present embodiment) 110, a vertical resonator (hereafter referred to as a "resonator") 140 formed on the semiconductor substrate 110, a first electrode 122, and a third electrode 124. The resonator 140 includes a first mirror 142, an active layer 144 and a second mirror 146.

Next, components of the surface-emitting type semiconductor laser 100 are described.

First, the resonator 140 is described. The resonator 140 has the first mirror 142, the active layer 144 and the second mirror 146, as described above. As the first mirror 142, for example, a distributed Bragg reflection type mirror (DBR) of 40 pairs of alternately laminated n-type $Al_{0.9} Ga_{0.1}$ As layers and n-type $Al_{0.15} Ga_{0.85}$ As layers can be used. The active layer 144 may be composed of GaAs well layers and $Al_{0.3} Ga_{0.7}$ As barrier layers in which the well layers include a quantum well structure composed of three layers. As the second mirror 146, a distributed Bragg reflection type mirror (DBR) composed of a semiconductor multilayer film of 25 pairs of alternately laminated p-type $Al_{0.9} Ga_{0.1}$ As layers and p-type $Al_{0.15} Ga_{0.85}$ As layers can be used. It is noted that the composition of each layer and the number of layers in the first mirror 142, the active layer 144 and the second mirror 146 may not be limited to the above.

The second mirror 146 is made to be p-type by doping, for example, C, Zn or Mg, and the first mirror 142 is made to be n-type by doping, for example, Si or Se. Accordingly, a pin diode is formed with the second mirror 146, the active layer 144 in which no impurity is doped, and the first mirror 142.

The second mirror 146, the active layer 144 and a part of the first mirror 142 compose a columnar semiconductor deposited body (also referred to as a "columnar section") 130. A side surface of the columnar section 130 is covered by an embedding dielectric layer 120.

A dielectric layer 132 that functions as a current constricting layer may be formed in a region near the active layer 144 among the layers composing the columnar section 130. The dielectric layer 132 may have a ring shape along the circumference of the columnar section 130. Also, the dielectric layer 132 for current constriction may be composed of, for example, aluminum oxide.

In the surface-emitting type semiconductor laser 100 in accordance with the present embodiment, an embedding dielectric layer 120 is formed in a manner to cover side surfaces of the columnar section 130. A dielectric material composing the embedding dielectric layer 120 may be any one of a variety of glasses, oxides of metals or resins. For example, polyimide resin, fluorine type resin, acrylic resin, epoxy resin, etc. can be used as the resin. In particular, the resin may preferably be polyimide resin or fluorine resin in view of their easiness of processing and nonconductivity.

The first electrode 122 is formed on the columnar section 130 and the embedding dielectric layer 120. The first electrode 122 may be formed from a single layer or a laminated film of two or more layers each consisting of a material selected from, for example, Au, Pt, Ti, Zn, Cr and an alloy of at least two of the aforementioned metals. For example, the first electrode 122 may be formed from a laminated film of layers of Cr, Ti, Pt and Au.

A second electrode 123 is formed on the first electrode 122. The second electrode 123 is formed from a single layer or a laminated film containing Au at least at its topmost surface, and may be formed from a laminated film of, for example, Cr and Au. The first electrode 122 and the second electrode 123 have opening sections, respectively. In a plan view, the opening section of the first electrode 122 is formed inside the opening section of the second electrode 123. A laser beam is emitted from the opening section of the first electrode 122.

Also, the second electrode 123 has an electrode pad section 129, as shown in FIG. 1. The second electrode 123 has a film thickness greater than that of the first electrode 122. Because the second electrode 123 has a greater film thickness, more stable bonding strength can be retained.

The first electrode 122 has a film thickness D in the range defined in Formula (1) below.

$$(4i+1) \lambda/8n \leq D \leq (4i+3) \lambda/8n \tag{1}$$

(In Formula (1), i is an integer, λ is an oscillation wavelength, and n is a refractive index of the material of the electrode. n is 1 that is the refractive index of air in FIG. 2.)

Figure 4A:
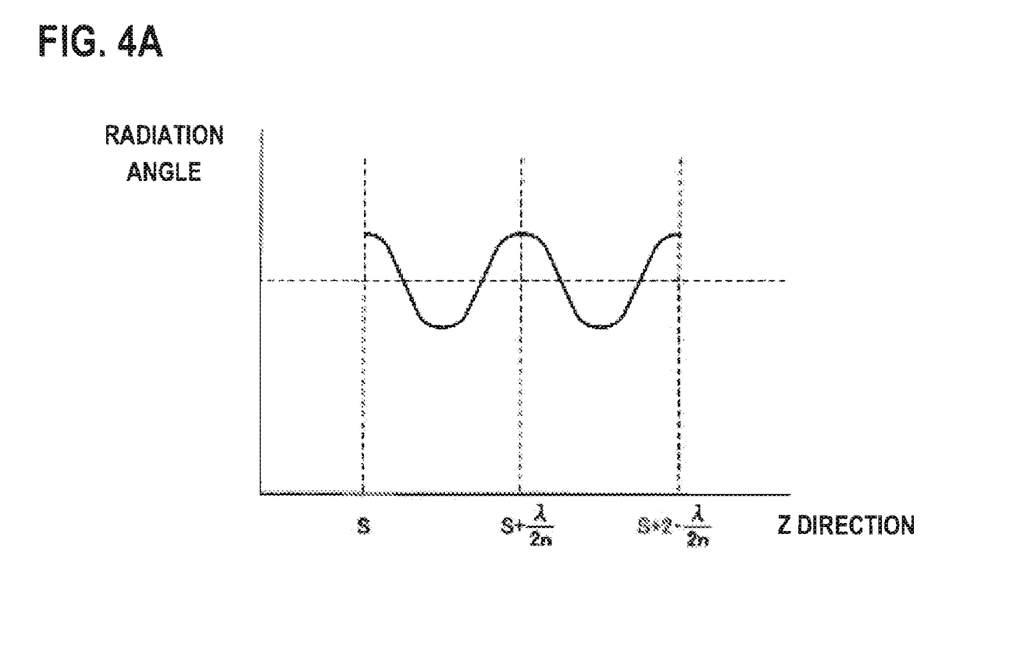
FIG. 4A is a graph showing the relation between the film thickness of an electrode and a radiation angle of a laser beam.
Figure 4B:
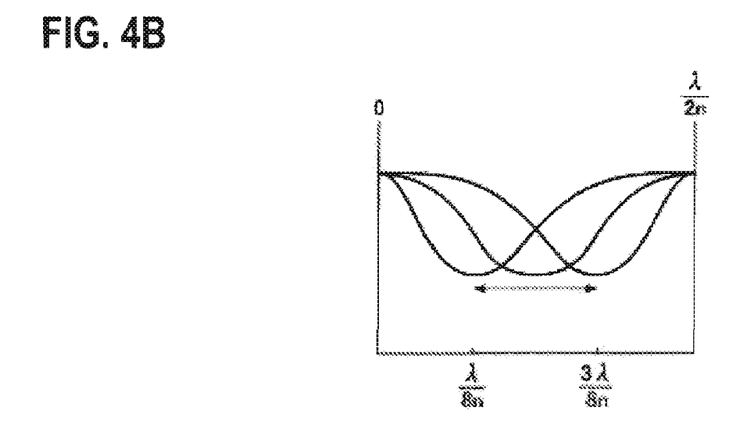
FIG. 4B is a graph showing the relation between the film thickness of an electrode whose film thickness D is in the range of $0<D\leq\lambda/2n$ and a radiation angle of a laser beam.

Advantages of the film thickness being in the range shown above are described with reference to FIGS. 4A and 4B. In FIG. 4A and FIG. 4B, the film thickness of an electrode is indicated along the axis of abscissas, and the radiation angle of a laser beam is indicated along the axis of ordinates. FIG. 4A is a graph showing the relation between the film thickness of the electrode and the radiation angle of the laser beam, and FIG. 4B is a graph showing the relation between the film thickness of the electrode whose film thickness D is in the range of $0<D\leq\lambda/2n$ and the radiation angle of the laser beam. It is noted that the results of radiation angles shown in FIG. 4A and FIG. 4B are obtained by a finite-difference time-domain (FDTD) method. The inventors in the present application have found that, as shown in FIG.

Figure 3:
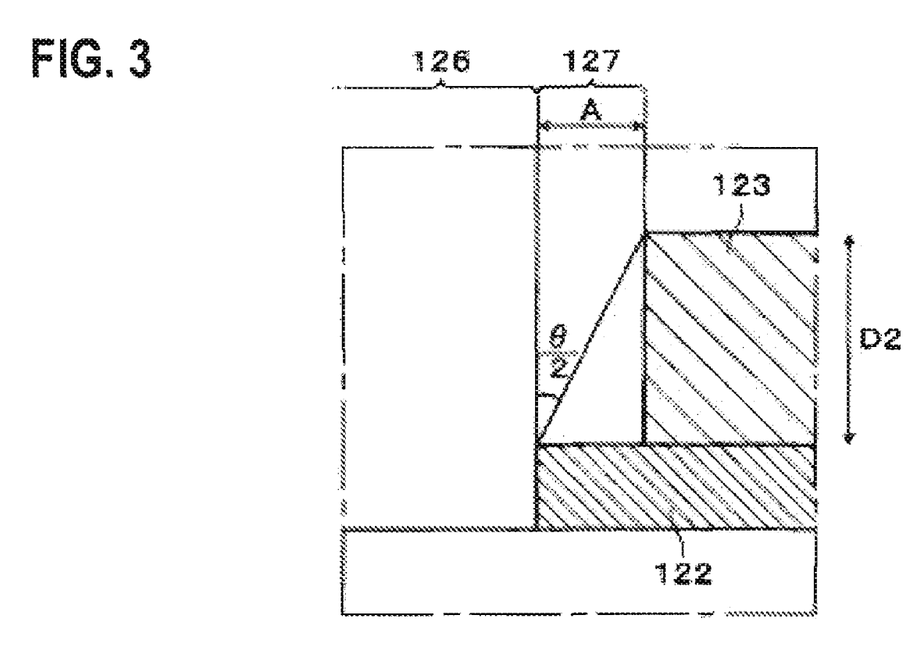
FIG. 3 is an enlarged view showing the detail of a region II indicated in FIG. 2.

4A, the radiation angle of a laser beam changes in a generally regular cycle with respect to the film thickness of the electrode. Concretely, the radiation angle changes in a cycle of $\lambda/2n$. Further, it has been found that the film thickness that gives the minimum radiation angle changes within a constant range with "$\lambda$(oscillation wavelength)/4n" as being a center. Then, it was examined as to how the minimum values of the radiation angle would change when the film thickness of electrodes was within the range of $0<D\leq\lambda/2n$. The results are shown in FIG. 4B. As seen from FIG. 3(B), it has been found that the position at which the radiation angle becomes the minimum changes when the film thickness D of electrodes is within the range of $\lambda/8n\leq D\leq 3\lambda/8n$. According to the above simulation results, by designing the film thickness of the first electrode 122 within the range defined by Formula (1) shown above, the radiation angle of a laser beam can be made small. As a result, a surface-emitting type semiconductor laser with excellent characteristics can be provided.

Also, the first electrode 122 has an exposed portion 127 around the circumference of the emission surface 126, which is not covered by the second electrode 123. Furthermore, the film thickness of the second electrode 123 may preferably be a film thickness D2 that meets Formula (2) shown below.

$$A \geq D2 \times \tan(\theta/2) \quad (2)$$

(In Formula (2), A is a difference between the diameter of the emission surface and the inner diameter of the second electrode, and $\theta$ is a radiation angle.)

Formula (2) is described with reference to FIG. 3. FIG. 3 is an enlarged view of a region II indicated in FIG. 2. When the radiation angle of the laser beam is $\theta$, and when the difference A between the diameter of the emission surface and the inner diameter of the second electrode, which defines the size of the exposed portion 127, is $D2 \times \tan(\theta/2)$ or greater, the laser beam theoretically does not interfere with the second electrode 123. Accordingly, when the difference A between the diameter of the emission surface and the inner diameter of the second electrode is $D2 \times \tan(\theta/2)$ or greater, the influence by the electromagnetic field of the second electrode 123 on the radiation pattern of the laser beam can be reduced.

Furthermore, the film thickness of the second electrode 123 may preferably be 0.2 μm or greater. If the film thickness of the second electrode 123 is less than 0.2 μm, there may be a possibility that wire bonding cannot be performed. More preferably, the film thickness of the second electrode 123 may be 1.0 μm or greater. By providing the second electrode 123 with a film thickness of 1.0 μm or greater, a sufficient bonding strength can be obtained at the time of mounting.

Moreover, the third electrode 124 is formed on the back surface of the semiconductor substrate 110. The third electrode 124 may be formed from a single layer or a laminated film of two or more layers each consisting a material selected from, for example, Au, Ge, Ni, In, W and Cr and an alloy of at least two of the aforementioned metals, and may be formed from a laminated film of, for example, Cr, AuGe, Ni, Au layers. In other words, in the surface-emitting type semiconductor laser 100 shown in FIG. 1 and FIG. 2, the first electrode 122 and the second electrode 123 connect to the second mirror 146 on the columnar section 130, and the third electrode 124 connects to the semiconductor substrate 110. An electrical current is injected in the active layer 144 by the first electrode 122, the second electrode 123 and the third electrode 124.

According to the surface-emitting type semiconductor laser 100 of the present embodiment, when the film thickness of the first electrode 122 is controlled to satisfy Formula (1) described above, the radiation angle of the laser beam can be made smaller. As a result, a surface-emitting type semiconductor laser with excellent characteristics can be provided.

However, in general, when an electrode is formed in a film, its film thickness may vary, and there may be cases where the film thickness of the first electrode 122 cannot be controlled in a manner to satisfy Formula (1). More concretely, for example, when i=7, n=3, and $\lambda$=850 nm in Formula (1) described above, the range of a suitable film thickness D would be 1027 nm$\geq$D$\geq$1097 nm. When a film is to be formed to a film thickness of 1062 nm, which is a center value of the range of the film thickness D, the actual film thickness may become 1062±53 nm when variations in the film thickness to be considered are ±5%. In this case, there is a possibility that the film thickness of the first electrode 122 cannot be controlled within the range of a suitable film thickness D, and the first electrode 122 having a film thickness outside the range of a suitable film thickness D may be formed.

On the other hand, for example, when i=0, n=3, and $\lambda$=850 nm in Formula (1) described above, the range of a suitable film thickness D would be 35 nm$\geq$D$\geq$106 nm. When a film is to be formed to a film thickness of 70 nm, which is a center value of the range of the film thickness D, the actual film thickness may become 70±3.5 nm when variations in the film thickness to be considered are ±5%. In this case, the film thickness of the first electrode 122 can be controlled within the range of a suitable film thickness D.

In other words, the greater the film thickness, the greater the difference tends to become. Therefore, to better control the film thickness of the first electrode 122 to satisfy Formula (1), its film thickness may preferably be smaller. However, when the film thickness of the first electrode 122 is small, there may be a problem in that the wire bonding strength may be lowered. In this respect, by forming the second electrode 123 having a film thickness that can provide a sufficient bonding strength on the first electrode 122, the film thickness of the first electrode 122 can be controlled to satisfy Formula (1).

2. Operation of Device

General operations of the surface-emitting semiconductor laser 100 of the present embodiment are described below. It is noted that the following method for driving the surface-emitting type semiconductor laser 100 is described as an example, and various changes can be made without departing from the subject matter of the present invention.

When applying a voltage in a forward direction to the pin diode by the first electrode 122, and the second electrode 123 and the third electrode 124, recombinations of electrons and holes occur in the active layer 144, thereby causing emission of light due to the recombinations. Stimulated emission occurs during the period the generated light reciprocates between the second mirror 146 and the first mirror 142, whereby the light intensity is amplified. When the optical gain exceeds the optical loss, laser oscillation occurs, whereby a laser beam is emitted from the emission surface 126 at the upper surface of the columnar section 130 in a direction perpendicular to the semiconductor substrate 110.

3. Method for Manufacturing Surface-Emitting Laser

Next, an example of the method for manufacturing the surface-emitting type semiconductor laser 100 shown in FIG. 1 and FIG. 2 is described with reference to FIG. 5 through FIG. 9. FIG. 5 through FIG. 9 are cross-sectional views schematically showing a process for manufacturing the surface-emitting type semiconductor laser 100 shown in FIG. 1 and FIG. 2, each of which corresponds to the cross section shown in FIG. 2.

Figure 5:
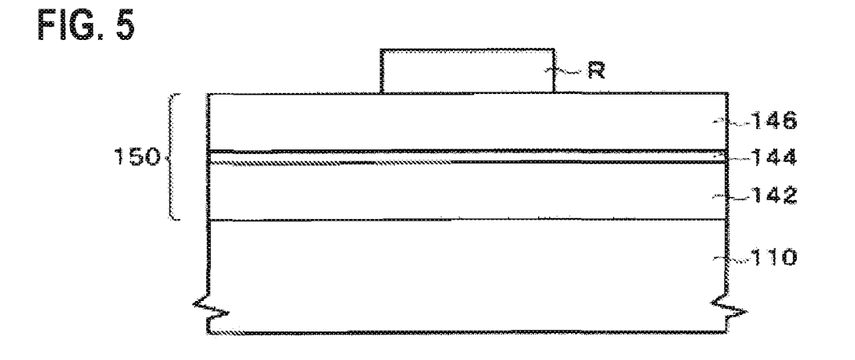
FIG. 5 schematically shows a cross-sectional view showing a step of a method for manufacturing a surface-emitting type semiconductor laser in accordance with an embodiment of the invention.

(1) First, as shown in FIG. 5, on the surface of the semiconductor substrate 110 composed of n-type GaAs, a semiconductor multilayer film 150 is formed by epitaxial growth while varying the composition. It is noted here that the semiconductor multilayer film 150 is formed from, for example, a first mirror 142 of 40 pairs of alternately laminated n-type $Al_{0.9}Ga_{0.1}As$ layers and n-type $Al_{0.15}Ga_{0.85}As$ layers, an active layer 144 composed of GaAs well layers and $Al_{0.3}Ga_{0.7}As$ barrier layers in which the well layers include a quantum well structure composed of three layers, and a second mirror 146 of 25 pairs of alternately laminated p-type $Al_{0.9}Ga_{0.1}As$ layers and p-type $Al_{0.15}Ga_{0.85}As$ layers. These layers are successively laminated on the semiconductor substrate 110 to thereby form the semiconductor multilayer film 150.

The topmost layer in the second mirror 146 may preferably be formed from a p-type $Al_{0.9}Ga_{0.1}As$ layer of a lower refractive index. Also, in the second mirror 146, the p-type $Al_{0.9}Ga_{0.1}As$ layers may be replaced with AlAs layers.

When growing the second mirror 146, at least one layer adjacent to the active layer 144 may be formed with an AlAs layer or an AlGaAs layer that becomes a dielectric layer 132 for current constriction when oxidized later. Al composition of the AlGaAs layer that becomes the dielectric layer 132 is 0.95 or greater. Also, the layer at the topmost surface of the second mirror 146 may preferably be formed to have a high carrier density, such that an ohmic contact can be readily made with an electrode (e.g., the first electrode 122).

The temperature at which the epitaxial growth is conducted is appropriately decided depending on the growth method, the kind of raw material, the type of the semiconductor substrate 110, and the kind, thickness and carrier density of the semiconductor multilayer film 150 to be formed, and in general may preferably be 450° C.-800° C. Also, the time required for conducting the epitaxial growth is appropriately decided just like the temperature. Also, a metal-organic chemical vapor deposition (MOVPE: Metal-Organic Vapor Phase Epitaxy) method, a MBE method (Molecular Beam Epitaxy) method or a LPE (Liquid Phase Epitaxy) method can be used as a method for the epitaxial growth.

Then, resist is coated on the semiconductor multilayer film 150, and then the resist is patterned by a lithography method, thereby forming a resist layer R having a predetermined pattern, as shown in FIG. 5. The resist layer R is formed above an area where a columnar section 130 (see FIG. 1 and FIG. 2) is planned to be formed.

Figure 6:
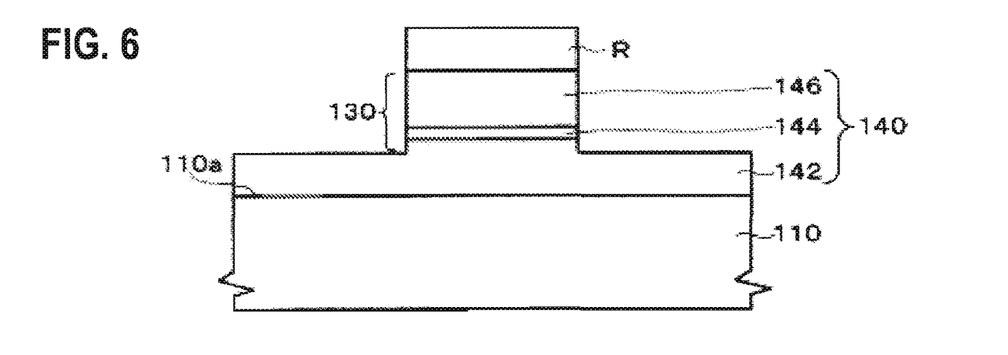
FIG. 6 schematically shows a cross-sectional view showing a step of the method for manufacturing a surface-emitting type semiconductor laser in accordance with an embodiment of the invention.

(2) Then, the second mirror 146, the active layer 144 and a part of the first mirror 142 are etched by, for example, a dry etching method, using the resist layer R as a mask, whereby a columnar semiconductor deposited body (columnar section) 130 is formed, as shown in FIG. 6. Then, the resist R is removed.

Figure 7:
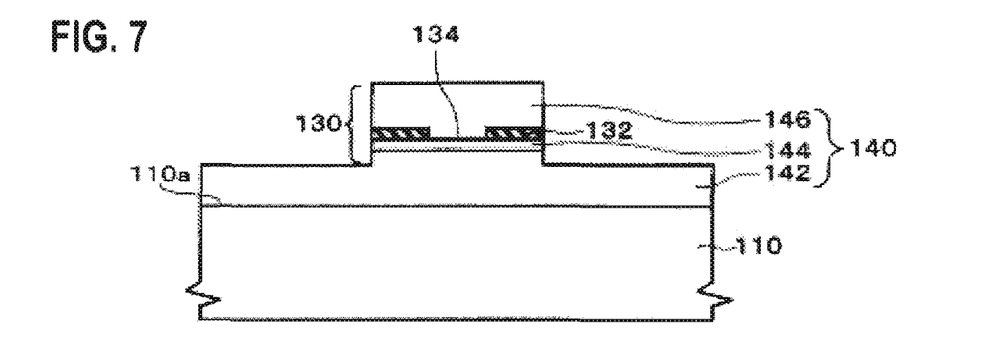
FIG. 7 schematically shows a cross-sectional view showing a step of the method for manufacturing a surface-emitting type semiconductor laser in accordance with an embodiment of the invention.

(3) Next, as shown in FIG. 7, by placing the semiconductor substrate 110 on which the columnar section 130 is formed through the aforementioned steps in a water vapor atmosphere at about 400° C., for example, a layer having a high Al composition (a layer with an Al composition being 0.95 or higher) provided in the above-described second mirror 146 is oxidized from its side surface, thereby forming the dielectric layer 132 for current constriction. The oxidation rate depends on the furnace temperature, the amount of water vapor that is supplied, and the Al composition and the film thickness of the layer to be oxidized.

Figure 8:
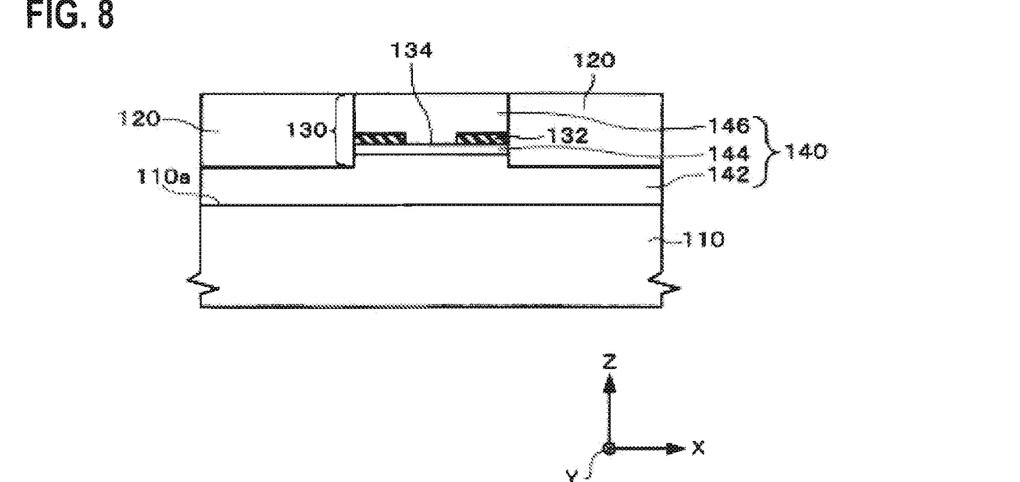
FIG. 8 schematically shows a cross-sectional view showing a step of the method for manufacturing a surface-emitting type semiconductor laser in accordance with an embodiment of the invention.

(4) Next, as shown in FIG. 8, an embedding dielectric layer 120 that embeds the columnar section 130, in other words, a part of the first mirror 142, the active layer 144 and the second mirror 146, is formed.

Here, an example in which polyimide resin is used as a material for forming the embedding dielectric layer 120 is described. First, a precursor (polyimide precursor) is coated on the semiconductor substrate 110 having the columnar section 130 by using, for example, a spin coat method, to thereby form a precursor layer. In this instance, the precursor layer is formed such that its film thickness becomes greater than the height of the columnar section 130. As the method of forming the precursor layer, besides the aforementioned spin coat method, another known technique, such as, a dipping method, a spray coat method, a droplet discharge method or the like can be used.

Then, the semiconductor substrate 110 is heated by using, for example, a hot plate or the like, thereby removing solvent from the precursor layer, and then semi-dried at about 200° C. Then, as shown in FIG. 8, after exposing an upper surface 130a of the columnar section 130, the semiconductor substrate is placed in a furnace at about 350° C. to imidize the precursor layer, thereby forming an embedding dielectric layer 120 that is almost completely hardened. As a method for exposing the upper surface 130a of the columnar section 130, a CMP method, a dry etching method, a wet etching method or the like can be used. Also, the embedding dielectric layer 120 may be formed with a resin that has photosensitivity. The embedding dielectric layer 120 or a layer at each stage leading to hardening may be patterned by lithography or the like depending on the requirements.

(5) Next, the steps of forming a first electrode 122 for injecting an electric current into the active layer 144, a third electrode 124, and an emission surface 126 (see FIG. 9) of a laser beam are described.

Figure 9:
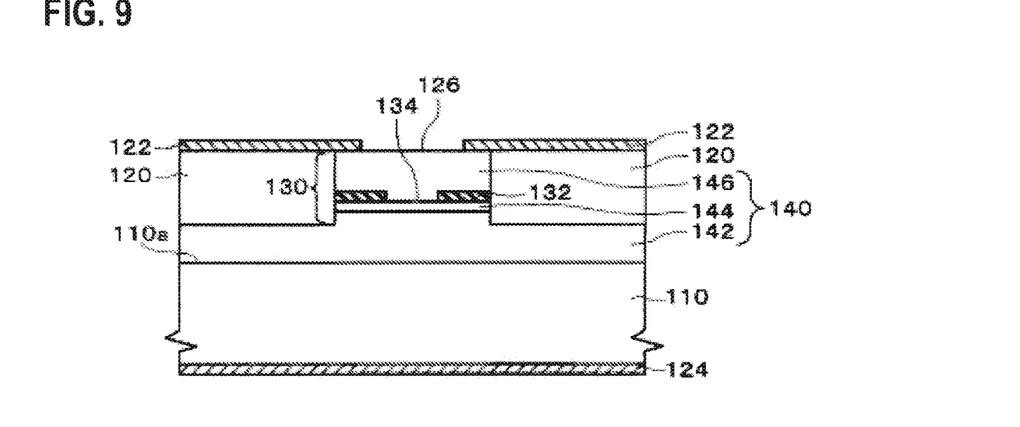
FIG. 9 schematically shows a cross-sectional view showing a step of the method for manufacturing a surface-emitting type semiconductor laser in accordance with an embodiment of the invention.

Prior to forming the first electrode 122 and the third electrode 124, exposed upper surfaces of the columnar section 130 and the semiconductor substrate 110 are washed by using a plasma treatment method, or the like depending on the requirements. As a result, a device with more stable characteristics can be formed. Then, as shown in FIG. 9, for example, a patterned resist layer and a multilayer film of, for example. Cr, Ti, Pt and Au are formed by, for example, a vacuum deposition method on the upper surface of the embedding dielectric layer 120 and the columnar section 130. Then a portion where the multilayer film is not formed is formed on the upper surface of the columnar section 130 by a lift-off method. This portion becomes an emission surface 126. It is noted that, in the above step, a dry etching method or a wet etching method can be used instead of the lift-off method. In this instance, the first electrode 122 is formed such that its film thickness is within the desired range, as described above.

Furthermore, a multilayer film formed from, for example, Cr, AuGe, Ni and Au, is formed by, for example, a vacuum deposition method on the exposed surface of the semiconductor substrate 110.

(6) Next, the step of alloying the first electrode 122 and the third electrode 124 formed in (5) is described. Alloying is conducted by an annealing treatment. The temperature of the annealing treatment depends on the electrode material. This is usually conducted at about 400° C. for the electrode material used in the present embodiment. By the steps described above, the first electrode 122 and the third electrode 124 are formed, and ohmic contacts can be obtained.

(7) Next, the step of forming a second electrode 123 (see FIG. 2) is described. The second electrode 123 may be formed as follow. A patterned resist layer and a multilayer film of, for example, Au and Cr are formed by, for example, a vacuum deposition method on the upper surface of the first electrode 122. Then a portion where the multilayer film is not formed is formed on the upper surface of the first electrode 122 by a lift-off method. This portion becomes an exposed section 127. It is noted that, in the above step, a dry etching method or a wet etching method can be used instead of the lift-off method. In this instance, the second electrode 123 is formed such that its film thickness is within the desired range, as described above.

By the steps described above, a surface-emitting type semiconductor laser 100 in accordance with the present embodiment can be formed.

According to the method for manufacturing a surface-emitting type semiconductor laser in accordance with the present embodiment, the alloying step in the step (6) is conducted before forming the second electrode 123. In other words, after the second electrode 123 is formed, an anneal treatment does not need to be conducted, such that diffusion of Cr into the topmost surface of Au by an anneal treatment can be prevented, and the surface of the second electrode 123 can be prevented from being oxidized.

4. Modified Examples

A variety of modifications can be made, without being limited to the embodiment described above, in the surface-emitting laser of the present embodiment within the range of the subject matter of the invention. An example of such modified example is described below.

Figure 10:
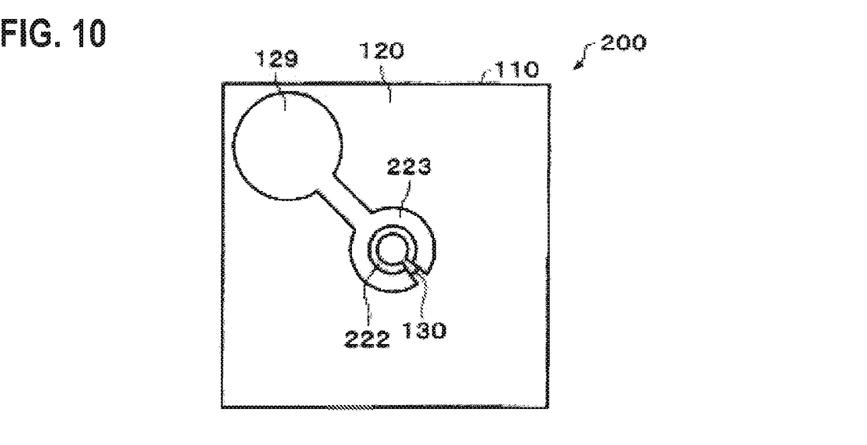
FIG. 10 schematically shows a plan view of a surface-emitting type semiconductor laser in accordance with a modified example of the invention.

FIG. 10 schematically shows a plan view of a surface-emitting type semiconductor laser in accordance with a modified example. It is noted that FIG. 10 is a plan view of the surface-emitting type semiconductor laser in accordance with the modified example, and corresponds to the cross-sectional view shown in FIG. 1.

The surface-emitting type semiconductor laser 200 of the modified example has a first electrode 222 and a second electrode 223 that are in an open ring shape, and therefore differs from the surface-emitting type semiconductor laser 100 having the first electrode 122 and the second electrode 123 that are in a ring shape.

It is noted here that the open ring shape refers to a ring shape that has a cut section at least a part thereof as shown in FIG. 10. The ring shape is not limited to a circular ring, but may also be a quadrangle or polygon ring.

As shown in FIG. 1, when the first electrode 122 and the second electrode 123 each have a ring shape, an isolated pattern of photoresist is formed inside the ring shape at the time of the lift-off step conducted when the first electrode 122 and the second electrode 123 are formed. It is difficult to remove the isolated pattern, and the metal material that has been lifted off would likely be re-adhered. In this respect, the first electrode 222 and the second electrode 223 are formed in an open ring shape, whereby the first electrode 222 and the second electrode 223 can be formed without forming an isolated pattern. As a result, the production yield can be made better. It is noted that, in FIG. 10, the cuts of the first electrode 222 and the second electrode 223 are formed at a position where they overlap with each other, as viewed in a plan view, but they can be formed at mutually different positions in a plan view, in other words, at different positions where they do not overlap in a plan view.

The invention many include compositions that are substantially the same as the compositions described in the embodiments (for example, a composition with the same function, method and result, or a composition with the same objects and result). Also, the invention includes compositions in which portions not essential in the compositions described in the embodiments are replaced with others. Also, the invention includes compositions that achieve the same functions and effects or achieve the same objects of those of the compositions described in the embodiments. Furthermore, the invention includes compositions that include publicly known technology added to the compositions described in the embodiments.

What is claimed is:

1. A surface-emitting type semiconductor laser comprising:
    a first mirror;
    an active layer formed above the first mirror;
    a second mirror formed above the active layer;
    a first electrode formed above the second mirror; and
    a second electrode formed above the first electrode,
    wherein each of the first electrode and the second electrode has an opening section, and the opening section of the first electrode is formed inside the opening section of the second electrode in a plan view, and
    the second electrode has a film thickness of 0.2 µm or greater.

2. A surface-emitting type semiconductor laser according to claim 1, wherein at least the active layer and the second mirror form a columnar section, and at least of part of the second electrode is formed above at least the columnar section.

3. A surface-emitting type semiconductor laser according to claim 1, wherein the second electrode has a film thickness greater than a film thickness of the first electrode.

4. A surface-emitting type semiconductor laser according to claim 1, wherein the first electrode has a film thickness D1 that meets Formula (1) as follows, $$(4i+1)\lambda/8n \leq D1 \leq (4i+3)\lambda/8n \tag{1}$$

where, i is an integer, $\lambda$ is an oscillation wavelength, and n is a refractive index of a material of the first electrode.

5. A surface-emitting type semiconductor laser according to claim 1, wherein the second electrode has a film thickness D2 that meets Formula (2) as follows, $$A \geq D2 \times \tan(\theta/2) \tag{2}$$

wherein A is a difference between a diameter of an emission surface and an inner diameter of the second electrode, and $\theta$ is a radiation angle.

6. A surface-emitting type semiconductor laser according to claim 1, wherein the first electrode is formed from a single layer or a laminated film of two or more layers each selected from Au, Pt, Ti, Ge, Zn, Ni, In, W, Cr and an alloy thereof.

7. A surface-emitting type semiconductor laser according to claim 1, wherein the second electrode is formed from a single layer or a laminated film containing Au at least at a topmost surface thereof.

8. A surface-emitting type semiconductor laser according to claim 1, wherein the second electrode has an electrode pad section.

9. A surface-emitting type semiconductor laser according to claim 1, wherein each of the first electrode and the second electrode has an open ring shape.

10. A surface-emitting type semiconductor laser according to claim 1, wherein at least the active layer and the second mirror form a columnar section, and the opening section of the second electrode is formed inside the columnar section when projected in a plane for plan view.

11. A surface-emitting type semiconductor laser according to claim 1, wherein the second mirror include a dielectric layer, and the dielectric layer has an opening section, and an outer edge of the opening section of the dielectric layer is formed inside an outer edge of the opening section of the first electrode when projected in a plane for plan view.

12. A surface-emitting type semiconductor laser according to claim 1, wherein a thickness of the second electrode is 1.0 µm or greater.

* * * * *